United States Patent [19]

Tanigawa

[11] Patent Number: 4,757,341
[45] Date of Patent: Jul. 12, 1988

[54] AC CONTACTLESS SWITCH

[75] Inventor: Kiyoshi Tanigawa, Tochigiken, Japan

[73] Assignee: Fuji Electric Co., Ltd., Kawasaki, Japan

[21] Appl. No.: 11,727

[22] Filed: Feb. 6, 1987

[30] Foreign Application Priority Data

Feb. 13, 1986 [JP] Japan ............... 61-29440

[51] Int. Cl.$^4$ ............... H03K 17/72; H03K 17/08
[52] U.S. Cl. ............... 307/648; 307/638; 307/308; 328/5
[58] Field of Search ............... 307/638, 639, 648, 308, 307/309; 328/5

[56] References Cited

U.S. PATENT DOCUMENTS

| 3,743,861 | 7/1973 | Bolmgren | 307/639 |
| 3,839,651 | 10/1974 | Michaels | 307/639 |
| 4,199,694 | 4/1980 | Van Zeeland | 307/639 |
| 4,667,144 | 5/1987 | Wiesgickl | 323/323 |

FOREIGN PATENT DOCUMENTS 58-85634  5/1983  Japan .

OTHER PUBLICATIONS

Simple Liquid Gauge with the Integrated Proximity Switch TCA 205, Siemens Components XVI (1981), No. 5, pp. 175-177.

Primary Examiner—John Zazworsky
Attorney, Agent, or Firm—Brumbaugh, Graves, Donohue & Raymond

[57] ABSTRACT

A contactless switch for controlling a thyristor switching element by means of a sensor circuit includes a bridge rectifier across whose input terminals are connected in series on AC power supply and a load and across whose output terminals are connected the thyristor. The switch includes a constant-voltage circuit which charges a capacitor whose charge controls the state of the thyristor. The constant-voltage circuit is controlled by a disabling circuit which is controlled by the output of the sensor circuit. There is included a timing circuit supplied by the output of a current detection circuit which measures the charging current and is able to suspend the functioning of the disabling circuit for a prescribed period of time.

2 Claims, 2 Drawing Sheets

AC CONTACTLESS SWITCH

FIELD OF THE INVENTION

The present invention relates to a contactless switch which controls a switching element, such as a thyristor, by the output signal of a sensor circuit.

BACKGROUND OF THE INVENTION

A conventional contactless switch of the kind which the invention seeks to improve is shown in FIG. 4. In FIG. 4, an AC power supply 1 and load 2 are connected in series, across the terminals $T_1$ and $T_2$. The input terminals of a single phase bridge rectifier circuit 3 are connected between these terminals $T_1$ and $T_2$, and a thyristor 4 is connected across the output terminals of this rectifier circuit 3. This thyristor 4 provides a switching operation and open and closes the series circuit consisting of the power supply 1 and the load 2 through the rectifier circuit 3. In parallel with the thyristor 4, there is connected a series circuit including a series type constant-voltage circuit 8 consisting of a transistor 5, Zener diode 6, and a resistor 7, and a transistor 11. As shown, the resistor 7 is connected between the base and collector of transistor 5 and the collector of transistor 11 is connected to the base of transistor 5 by way of the Zener diode 6. The emitter of transistor 5 and the emitter of transistor 11 are connected to the input terminals of a sensor circuit 10 which includes a detection coil 9. Sensor circuit 10 is of conventional design, such as the proximity switch Model TCA 205 commercially available from Siemens AG, in which the inductance of detection coil 9 changes when an intruder, for example, or other object approaches the coil. The input terminals of the sensor circuit 10 are connected through the constant-voltage circuit 8 across the thyristor 4. When the Zener voltage of the Zener diode 6 is at $V_{Z1}$, the voltage drop between the base and the emitter in the transistor 11 when a saturation current is flowing is $V_{CE}$. The constant-voltage circuit 8 applies the constant voltage of $V_{Z1}+V_{CE}-V_{BE}$ to the sensor circuit 10. The sensor circuit 10 turns the transistor 11 off by changing its output signal, which has been at a high level, to a low level when an object to be detected approaches the detection coil 9, thus disabling the constant-voltage function of the constant-voltage circuit 8. Reference numeral 12 indicates a capacitor connected in parallel with the sensor circuit 10. A gate circuit 15 consisting of a series circuit including Zener diode 13 and resistor 14, is connected in parallel with the capacitor 12, and the node between the Zener diode 13 and the resistor 14 is connected to the gate of the thyristor 4. The Zener voltage $V_{Z2}$ of the Zener diode 13 is selected so that $V_{Z2}+V_{GK}>V_{Z1}+V_{CE}-V_{BE}$, where $V_{GK}$ is the threshold gate-to-cathode voltage for turning on the thyristor 4. Since under this condition the Zener diode 13 is not conducting and the gate current of the thyristor 4 does not flow, the thyristor 4 is kept off.

When the subject approaches the detection coil 9, the output signal of the sensor circuit 10 assumes a low level and the transistor 11 turns off. Thus, the function of the constant-voltage circuit 8 is disabled and the current flowing in the resistor 7 becomes the base current of the transistor 5, resulting in an increase of the voltage across the capacitor 12. Accordingly, current flows to the gate of the thyristor 4 through the Zener diode 13 of the gate circuit 15, which turns the thyristor 4 ON and causes conduction through the load 2. When the thyristor 4 is ON, the voltage across its anode-cathode terminals is low, the current supply from the power supply 1 to the sensor circuit 10 is discontinued, and the sensor circuit 10 continues its detecting operation while consuming the charge of the capacitor 12. The thyristor 4 which is ON is turned OFF at each zero point of the current at the power supply frequency, which, however, has little effect. Since the capacitor 12 is being discharged while supplying current to the sensor circuit 10, its voltage eventually becomes lower than the Zener voltage $V_{Z2}$ of the Zener diode 13, the Zener diode 13 becomes nonconducting, and the thyristor 4 turns OFF. However, as the voltage across the terminals of the thyristor 4 rises, the transistor 5 turns ON and the capacitor 12 is charged. The thyristor 4 turns ON again when the voltage of capacitor 12 reaches the Zener voltage $V_{Z2}$ of the Zener diode 13. Thus, while an object is close to the detection coil 9, the thyristor 4 turns OFF momentarily at the zero point of AC full-wave rectification, but the effect of the whole switch is an ON status.

However, because the voltage of the capacitor 12, the driving voltage of the sensor circuit 10, has not risen to the voltage needed for operating the sensor circuit 10 normally when the power is initially applied, the output of such AC contactless switch is unstable, whether the detection signal is at high level or low level. Thus a malfunction is liable to occur, and the rectifier circuit and the thyristor apt to be damaged, when the load is short-circuited because of the failure of the load. Accordingly, it has been the tendency to protect the rectifier circuit and the thyristor by providing an overcurrent detection circuit in the thyristor circuit. However, the thyristor, once triggered ON, maintains the conductive status until the next current zero point. Thus a circuit of large capacity for withstanding such overcurrent is required and a resistor for limiting the current is usually needed to be connected in series. This causes useless power consumption.

An object of the present invention is to provide an AC contactless switch capable of protecting against overcurrent at the turning on of the power supply or, because of short-circuiting of the load.

SUMMARY OF THE INVENTION

The present invention improves on the prior art switching circuit described by the inclusion of a timing circuit which is controlled by a circuit which detects the output of the sensor circuit and in turn controls a circuit for disabling the constant-voltage circuit. In particular, the timing circuit serves to disable the constant-voltage circuit for a prescribed time after the initial application of power to the switch to minimize premature operation of the sensor circuit before the switch is stabilized.

Additionally, the current detection circuit acts to keep the switch open in the event that the load is short-circuited and the current in the switch rises excessively.

In the preferred embodiment of the invention, the timing circuit comprises a resistor and a capacitor connected in series across the input terminals of the sensor circuit and the node between the resistor and the capacitor is connected by way of a diode to the output of the sensor circuit and by way of a transistor to the current detection circuit.

The disabling circuit comprises a resistor and a first transistor connected serially between the input terminals of the sensor circuit, and the node between the resistor and the first transistor is connected to the base of a second transistor whose conductive state controls the functioning of the constant-voltage circuit. The conductive state of the first transistor, in turn, is controlled by the output of the sensor circuit.

The current detection circuit comprises a pair of transistors and a resistor which are connected across the input terminals of the sensor circuit, the collector of one of which is connected to the aforementioned node of the timing circuit.

The invention will be better understood from the following more detailed description taken in conjunction with the accompanying drawing.

BRIEF DESCRIPTION OF THE DRAWING

FIG. 2 is a time chart when the load is normal, and FIG. 3 is a time chart when the load is short-circuited.

DETAILED DESCRIPTION OF THE INVENTION

Figure 1:
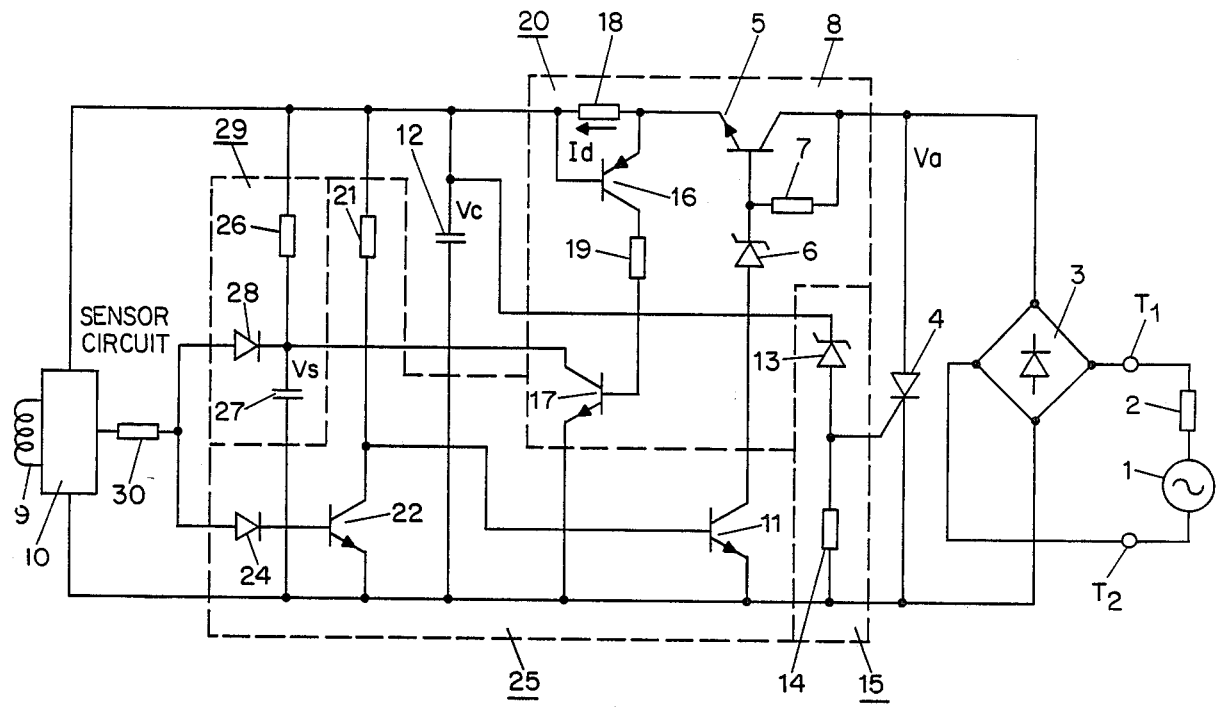
FIG. 1 is a schematic circuit diagram showing an embodiment of a contactless switch according to the present invention.
Figure 4:
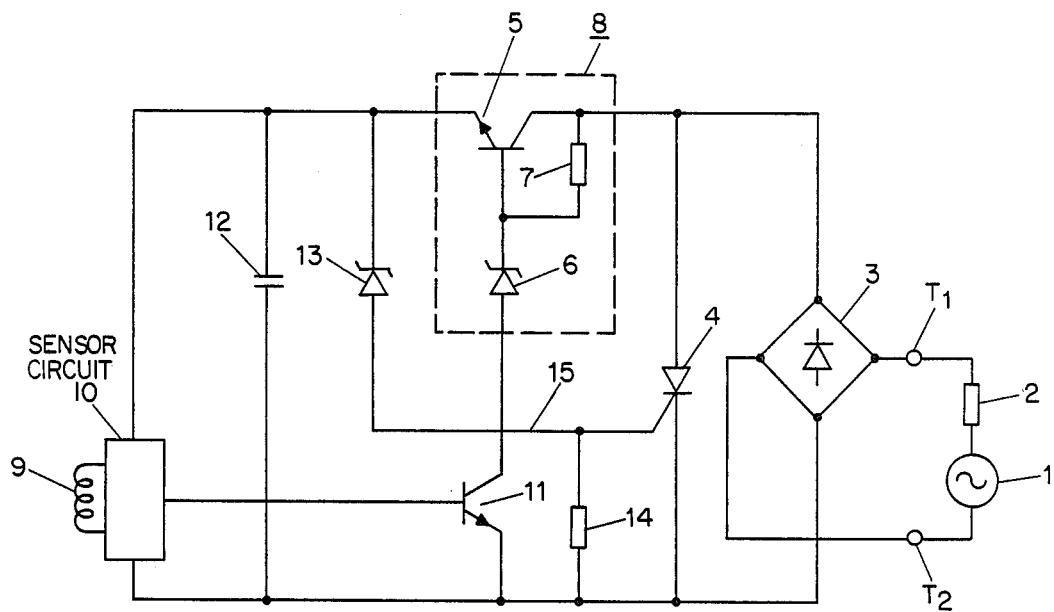
FIG. 4 is a schematic circuit diagram showing a conventional AC contactless switch.

An embodiment of the present invention is shown in FIG. 1 wherein like numerals indicate like parts and circuits shown in FIG. 4, a detailed description of which will not be repeated. In FIG. 1, similarly to a conventional unit, an AC power supply 1 and a load 2 are connected in series across the terminals $T_1$ and $T_2$, between which are also connected the input terminals of the single phase bridge rectifier 3, and a thyristor 4 is connected across the output terminals of this rectifier circuit 3. A series type constant-voltage circuit 8 consisting of a transistor 5, a Zener diode 6 and a resistor 7 is provided, and a transistor 11 constituting a part of constant-voltage disabling branch is connected in a series with the Zener diode 6 of the constant-voltage circuit 8. However, in this improved switch, the capacitor 12 is connected on the output side of the constant-voltage circuit 8 through a resistor 18 of a current detection circuit 20 consisting of a pair of transistors 16 and 17 and a pair of resistors 18 and 19. In the current detection circuit 20, the resistor 18 is connected between the base and the emitter of the transistor 16, and the collector of the transistor 16 is connected to the base of transistor 17 through resistor 19. This transistor 17 is connected by way of its emitter across the terminals of a capacitor 27 of a timing circuit 29 to be described later. In this current detection circuit 20, the transistor 16 is not turned ON as long as only a small current is flowing in the resistor 18, but is turned ON when a large current flows in this resistor 18, thereby to turn the transistor 17 ON through the resistor 19. Across the terminals of capacitor 12, a gate circuit 15 is formed by connecting a Zener diode 13 and a resistor 14 in series and the node therebetween to the gate of thyristor 4. A constant-voltage disabling circuit 25 consists of a resistor 21, a pair of transistors 11 and 22, and a diode 24. The timing circuit 29 consists of a resistor 26, a capacitor 27 and a diode 28. The output terminal of the sensor circuit 10 is connected to the base of the transistor 22 through a resistor 30 and the diode 24, and the node between the resistor 21 and the transistor 22 is connected to the base of the transistor 11. The emitter of transistor 22 is connected to an input terminal of the sensor circuit 10 and the collector is connected to the base of transistor 11. The node between the resistor 26 and the capacitor 27 is connected the output terminal of the sensor circuit 10 through the current limiting resistor 30 and the diode 28. The capacitor 27 is connected across the transistor 17 described above.

The operation of the contactless switch will now be described for the case where the load 2 is in a normal condition with reference to the waveforms shown in FIGS. 2(A), (B), (C), and (D). When the output of the sensor circuit 10 is at a low level, such as during the period from the time $t_0$ to the time $t_1$, the transistor 22 is not turned ON. Therefore, the transistor 11 is ON with the base current flowing through the resistor 21, and the constant-voltage circuit 8 is functioning normally. Accordingly, an AC full wave rectified voltage Va, rectified by the rectifier circuit 3 through the load 2 from the AC power supply 1, having the waveform $Va_1$ shown at FIG. 2(A), is applied to the anode of the thyristor 4 and to the constant-voltage circuit 8. The constant output voltage $V_{C1} = V_{Z1} + V_{CE} - V_{BE}$, as before, is applied to the sensor circuit 10 and the capacitor 12 through the current detection circuit 20. Accordingly, the capacitor 12 is charged to this voltage $V_{C1}$, as shown at FIG. 2(B). This output voltage $V_{C1}$ of the constant-voltage circuit 8 is set lower than the Zener voltage $V_{Z2}$ of the Zener diode 13, so no current flows to the gate of the thyristor 4 through Zener diode 13 and the thyristor 4 is kept OFF. The current Id through the resistor 18 is $Id_1$, as shown by the broken line in FIG. 2(C), which is extremely small and nearly constant, and only this current $Id_1$ and the current of the Zener diode 6 flow through the load 2. Thus the load 2 is virtually kept OFF. In this case, the voltage $V_S$ across the capacitor 27 is at the voltage $V_{S1}$, as shown at FIG. 2(D), which is almost constant.

Figure 2:
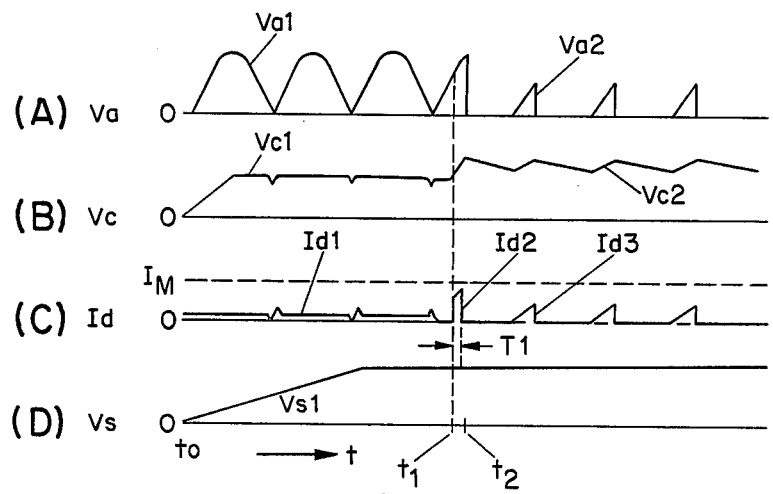
FIG. 2 and FIG. 3 show waveforms at particular nodes in the circuit shown in FIG. 1, where

The waveforms to the left of the vertical dotted line in FIG. 2 illustrate the circuit operation when the sensor circuit 10 detects the subject. When the output of sensor circuit 10 goes high, base current flows through the transistor 22, through the resistor 30, and the diode 24 at the time $t_2$, after the delay time $T_1$, due to the operation of the timing circuit 29 to be described later, whereupon transistor 22 is turned ON, and the transistor 11 is turned OFF with its base current bypassed. Accordingly, all the current flowing in the resistor 7 flows into the base of the transistor 5, the constant-voltage circuit 8 is disabled, and the output voltage $V_C$ rises to the voltage $V_{C2}$. At this time, the capacitor 12 is charged with the current $Id_2$, as shown at FIG. 2(C), through the resistor 18, and the charging voltage $V_{C2}$ of capacitor 12 rises as shown at FIG. 2(B). When the charging $V_{C2}$ of this capacitor 12 exceeds the sum of the Zener voltage $V_{Z2}$ of the Zener diode 13 and the gate-to-cathode threshold voltage $V_{GK}$ of the thyristor 4, gate current for the thyristor 4 flows through the Zener diode 13, ahd the thyristor 4 is turned ON. When the thyristor 4 is ON, power feed to sensor circuit 10 from the power supply 1 through the transistor 5 is discontinued, so the sensor circuit 10 is operated with the charge in the capacitor 12. The thyristor 4 returns to the OFF status briefly at the zero point of the AC power supply 1, and charging of capacitor 12 occurs again with the current $Id_3$ through the constant-voltage circuit 8. Thus the voltage $V_{C2}$ of the capacitor 12 rises and the thyristor 4 turns ON. Such operation is repeated at each zero point of the AC full wave rectification and the switch is kept essentially ON overall. Since the charging current Id through the resistor 18 is comparatively large momentarily relative to the current detection threshold level $I_M$ of the current detection circuit 20, shown by a broken line in FIG. 2(C), there is no change in the voltage $V_S$ across the capacitor 27.

Turning now to a description of the operation of the timing circuit 29 this circuit important roles in two operations of the switch as described below.

Before the application of AC power from source 1 all of the transistors are in the OFF state, and upon initial application of power at time $t_0$, capacitor 12 starts being charged through transisitor 5 and resistor 18 as indicated in waveform FIG. 2(B). At time $t_0$, sensor circuit 10 is in an unstable state and the output signal therefrom will be at high level because the voltage $V_c$ on capacitor 10 initially is insufficient to stabilize the sensor circuit. When the output signal current flowing in resistor 30 has charged capacitor 27 through the diode 28 to a voltage that exceeds the emitter-base voltage $V_{BE}$ of transistor 22, indicated by the broken line in waveform FIG. 3(D) (in practice, the voltage drop in the barrier layer of diode 24 should be added to $V_{BE}$), transistor 22 is turned ON. Since capacitor 12 applies the predetermined voltage $V_{C1}$ (FIG. 2(B) to the sensor circuit 10 before the voltage across capacitor 27 exceeds $V_{BE}$, the sensor circuit is stabilized and outputs a signal at low level.

Figure 3:
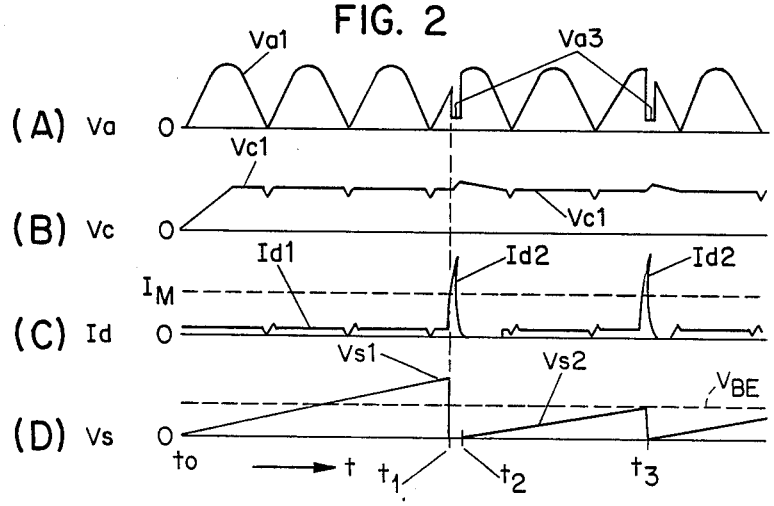

Referring now to the waveforms shown in FIGS. 3(A), 3(B), 3(C) and 3(D), the operation of the circuit in the case when load 2 is short-circuited will be described. Even if the load 2 is short-circuited, there is no problem when the output of the sensor 10 is at a low level, because the thyristor 4 is not turned ON. In this case, the waveforms of each portion are exactly the same as those for the period from the time $t_0$ to the time $t_l$, shown in FIG. 2, and are shown from the time $t_0$ to the time $t_1$ in FIG. 3. When the output of the sensor circuit 10 is at a low level, the current Id flowing through resistor 18 is at $Id_l$, which is insignificant as shown at FIG. 3(C), because constant voltage circuit 8 is functioning, a short-circuit in the load does not cause any trouble. However, the constant voltage circuit stops functioning when the output from sensor 10 shifts to a high level because transistor 22 turns OFF and, in turn, triggers transistor 11 to its OFF state, as previously described. With the constant voltage circuit not functioning, the power supply 1 charges capacitor 2 through the transistor 5 and resistor 18; since the current $I_d$ for charging capacitor 12 is, as a practical matter, limited solely by resistor 18, it changes very abruptly, as shown at $I_{d2}$ in FIG. 3(c), and only momentarily exceeds the current detection level $I_M$. When the voltage drop of the resistor 18 exceeds the base-to-emitter voltage of the transistor 16 in this manner, the transistor 16 is turned ON, which, in turn, causes the transistor 17 to be turned ON. Thus, the capacitor 27 is discharged rapidly to the zero voltage as shown at FIG. 3(D). Accordingly, the base voltage of the transistor 22 drops, thereby turning it OFF. Then, the transistor 11 is turned ON, the constant-voltage circuit 8 operates to keep its output voltage at the predetermined voltage and to limit the voltage $V_C$ of the capacitor 12 to the voltage $V_{C1}$. Thus the Zener diode 13 continues to be non-conducting, and the thyristor 4 is not turned ON. When the voltage $V_C$ of the capacitor 12 is limited, the voltage drop across the resistor 18 is lowered, both transistors 16 and 17 are turned OFF and the voltage $V_S$ of the capacitor 27 starts charging, as shown by the voltage $V_{S2}$ at FIG. 3(D). The transistor 22 is turned ON and the transistor 11 is turned OFF after a predetermined time. The constant-voltage circuit 8 is disabled, the capacitor 12 is charged again, and both transistors 16 and 17 are turned ON. Thus the voltage $V_S$ of the capacitor 27 is discharged down to the zero voltage again at the time $t_3$, as shown in FIG. 3(D). Such operation being repeated, the thyristor 4 does not conduct. Moreover, the anode voltage Va of the thyristor 4 is lowered momentarily, as shown with the voltage $Va_3$ in FIG. 3(A) only when the capacitor 12 is charged, but it holds the waveform of the AC full wave rectified voltage $Va_1$ on the whole.

As described, according to the present invention, by providing the switch with a timing circuit, a malfunction of the thyristor is prevented during the period while the circuit operation is becoming stabilized even if the output signal of the sensor circuit becomes high level. There is also gained the advantage that damage of the rectifier circuit and the thyristor due to the overcurrent is prevented by providing the current detection circuit and preventing conduction of the thyristor through the timing circuit when the current through the current detection circuit exceeds a predetermined value because of short-circuiting of the load.

It is to be understood that various changes will be evident to a worker in the art, which can be made without departing from the spirit of scope of the present invention.

What is claimed:

1. A switch comprising:
   rectifying means having a pair of input terminals adapted to be supplied by a power supply in series with a load and a pair of output terminals;
   a thyristor having its anode and cathode connected to the pair of output terminals of the rectifying means;
   constant-voltage circuit means;
   current-detection circuit means;
   first capacitor circuit means connected to be charged by the voltage across the output terminals of the rectifying means by way of the constant-voltage circuit means and the current detection circuit means;
   sensor circuit means having a pair of input terminals connected across the first capacitor means and an output terminal, and adapted to produce an output signal on its output terminal when sensing an object to be detected;
   gating circuit means supplied by said first capacitor circuit means for triggering the thyristor means when its charging voltage exceeds a prescribed level;
   constant-voltage disabling means supplied by an output signal of the sensor circuit means for disabling the constant-voltage circuit means; and
   timing circuit means adapted for suspending the disabling function of the constant-voltage disabling means for a prescribed time under control of the current detection circuit means.

2. A switch in accordance with claim 1 in which:
   the current detection circuit means comprises a first transistor whose emitter is connected to one input of the sensor circuit means and to its base by way of a resistor, a second transistor whose base is connected to the collector of the first transistor by way of a resistor, and whose collector is connected to a node of the timing circuit means, and whose emitter is connected to the other input of the sensor circuit means;

the timing circuit means includes a resistor, one terminal of which is connected to said one input of the sensor circuit means and whose other terminal is connected to the collector of the second transistor, a capacitor, one terminal of which is connected to the collector of the second transistor and the other terminal of which is connected to the emitter of the second transistor, said one terminal of the capacitor being supplied with the output signal of the sensor circuit means; and the disabling circuit means comprises a resistor and a transistor connected in series between the input terminals of the sensor circuit means, the base of the transistor being supplied by the output signal of the sensor circuit means, the node between the resistor and the collector of the transistor being connected for controlling the constant-voltage circuit means.

* * * * *